United States Patent [19]
Jones

[11] Patent Number: 5,796,578
[45] Date of Patent: Aug. 18, 1998

[54] RF GROUNDING AND HEAT DISTRIBUTION SYSTEM FOR A PORTABLE COMPUTER INCLUDING A SLIP JOINT HINGE WITH A BANANA PLUG TYPE MALE INTRUSION MEMBER

[75] Inventor: Leroy Jones, Austin, Tex.

[73] Assignee: Dell USA, L.P., Round Rock, Tex.

[21] Appl. No.: 744,489

[22] Filed: Nov. 6, 1996

[51] Int. Cl.$^6$ ............................... G06F 1/16; H05K 9/00
[52] U.S. Cl. .................... 361/683; 361/681; 361/687; 361/818; 174/35 R
[58] Field of Search ................ 16/223, 342; 439/31, 439/92, 95, 165; 206/709, 719, 721; 174/50, 51, 52.1, 35 R; 361/681, 683, 687, 816, 818; 364/708.1

[56] References Cited

U.S. PATENT DOCUMENTS

| | | | |
|---|---|---|---|
| 2,704,301 | 3/1955 | Feketics | 439/31 X |
| 4,706,438 | 11/1987 | Ohlbach | 206/721 X |
| 5,173,837 | 12/1992 | Blackwell et al. | 16/342 X |
| 5,313,362 | 5/1994 | Hatada et al. | 361/687 X |
| 5,379,183 | 1/1995 | Okonsky et al. | 16/342 X |

FOREIGN PATENT DOCUMENTS

| | | | |
|---|---|---|---|
| 3-94496 | 4/1991 | Japan | 174/35 R |
| WO 94/22283 | 9/1994 | WIPO | 174/35 R |

OTHER PUBLICATIONS

RCA Technical Notes, "Electrical Hinge Joints", Michael F. Jarvis and William R. Hubscher, sheets 1 and 2, Sep. 25, 1968, copy in 16–223.

RCA Technical Notes, "Swing Out Hinge Connector", William A. Brady, Jr. and John W. Krishner, sheets 1 and 2, Jun. 1960, copy in 439–165.

*Primary Examiner*—Michael W. Phillips
*Attorney, Agent, or Firm*—Skjerven, Morrill, MacPherson, Franklin & Friel, LLP; Stephen A. Terrile

[57] ABSTRACT

A grounding system for a portable computer system which provides the computer system with a desirable RF (radio frequency) grounding and heat distribution characteristics. The grounding system includes a top panel, a back panel, and a bottom panel, where the panels are constructed of electrically conductive material. The bottom panel is electrically and physically connected to the back panel. The top panel and back panel are connected physically and electrically via low impedance hinges. A computer display such as a liquid crystal display (LCD) is electrically and physically coupled to the top panel, and a system planar printed wiring board is electrically and mechanically coupled to the bottom panel. The grounding system includes side panels constructed of electrically conducted material that are electrically and physically connected to both the top panel and the bottom panel. The top panel and the back panel are also connected via a spring hinge. Mounting bosses are attached to the top panel and the display. Mounted bosses are also attached to the bottom panel and the display. Heat is transferred from the bottom panel to the top panel via the back panel and the hinges. The low impedance hinge is a slip joint hinge with a banana plug type male intrusion member.

46 Claims, 8 Drawing Sheets

RF GROUNDING AND HEAT DISTRIBUTION SYSTEM FOR A PORTABLE COMPUTER INCLUDING A SLIP JOINT HINGE WITH A BANANA PLUG TYPE MALE INTRUSION MEMBER

BACKGROUND OF THE INVENTION

1. Field of the Invention

The present invention relates to a portable computer system, and more particularly to a radio frequency (RF) grounding and a heat distribution system for a portable computer system.

2. Description of the Related Art

Personal computer systems have attained widespread use. These personal computer systems now provide computing power to many segments of today's modern society. A personal computer system can usually be defined as a desktop, floor-standing, or portable microcomputer that includes a system unit having a system processor with associated memory, a display panel, a keyboard, a hard disk storage device or other type of storage media such as a floppy disk drive or a compact disk read only memory (CD ROM) drive. These personal computer systems are information handling systems which are designed primarily to give independent computing power to a single user or group of users and are inexpensively priced for purchase by individuals or small businesses.

A portable computer is a self-contained personal computer designed to be easily moved to and operated in various locations. Portable computers are often referred to as laptop, notebook or subnotebook computers. To be portable, these computers must be small, compact and lightweight. The conventional portable computer comprises a base portion and a lid portion that pivotally opens from the base portion when the portable computer is in use. The lid portion contains a flat panel display such as a liquid crystal display (LCD) or other relatively small display.

One challenge of designing and building portable computers is how to provide low impedance RF grounding for the LCD panel located in the lid portion of the portable computer. RF grounding provides the primary mechanism through which common-mode currents are returned to their source of origin. Common-mode currents in a computer system are currents whose return path is the system's common ground.

RF grounding has significantly different impedance characteristics than direct current (DC) electrical grounding. Very small DC resistances (e.g. milliohms) in the ground path typically represent no problem in a DC electrical grounding system. However, in high frequency devices such as portable computers that operate at RF frequencies such as 100 MHz, these small DC resistances result in very large impedances in the RF grounding system such as hundreds of Ohms.

In high frequency devices, common-mode currents require very low impedance paths to return to ground, otherwise, those currents will generate RF emissions. An increase in the impedance of the RF grounding system of a device leads to an increase in the RF emissions produced by that device. Consequently, it is desirable that the point-to-point impedance within the RF grounding system of a personal computer should never exceed 0.25 m$\Omega$ of DC resistance.

Because RF emissions have the potential to interfere with public, private, and military radio communication channels, the Federal Communications Commission and international organizations such as the Committee for European Electromechanical Standardization have set standards for acceptable levels of RF emissions generated by electronic devices. Low impedance RF grounding systems are needed to reduce RF emissions in order to meet these standards.

A major source of RF emissions in the portable computer is the liquid crystal display (LCD). Common mode currents cause RF emissions to be produced when transistors in the LCD switch from a low state to a high state. The amount of RF emissions produced by a transistor is dependent on the speed at which it changes states. Consequently, as portable computers increase in speed, the amount and levels of RF emissions caused by common mode currents will also increase. In addition, increases in the resolution of LCD displays has increased the number of transistors required per display and consequently increased the amount of common mode currents produced. For example, a passive monochrome display panel with a resolution of 640×480 pixels requires over 300,000 diodes switching simultaneously. An active color matrix requires over 900,000 transistors switching simultaneously. An 800×600 active color matrix requires over 1.44 million transistors switching simultaneously. A 1024×768 active color matrix will involve nearly 2½ million transistors switching simultaneously.

Several variations of multi-point grounding schemes have been used to provide RF grounding for the LCD display in the portable computer. These schemes include the use of hinges, braids, flex cable shields, copper tape, or combinations of the above to ground the LCD panel.

In addition to the RF emissions generated by the common mode currents resulting from switching transistors in the LCD, differential-mode currents created by the LCD power and data cables can also generate RF emissions. Differential-mode currents are currents that travel between pairs of wires that originate from a source drivers where one wire is the return path to the source as opposed to the common system ground. The RF emissions due to the differential-mode currents are usually inconsequential as compared with RF emissions generated by common-mode currents because most of the RF emissions produced by the LCD data and power cables are canceled by the return currents in those cables. However, not all of the RF emissions from differential-mode currents are canceled. Relatively expensive mechanical devices such as in-line filtering may be required to address the problem of RF emissions due to uncanceled differential-mode currents. In addition to increasing costs, these devices take up valuable space in the portable computer.

Heat distribution has also been a problem with some portable computers. In the past, "heat spreaders" have been used to deal with this problem. A heat spreader is a flat metal piece that lies beneath the processor and distributes heat along the bottom of the unit. Because heat spreaders serve only one function, heat spreaders add extra pieces to the assembly and increase the complexity of the build and repair operations.

SUMMARY OF THE INVENTION

It has been discovered that providing a portable computer system with top, bottom and back electrically conductive panels coupled via a low impedance hinge advantageously provides the computer system with desirable RF grounding and heat distribution characteristics.

More specifically, in one aspect of the invention, a grounding system includes a top panel constructed of an electrically conductive material, a bottom panel constructed of a electrically conductive material, and a back panel physically and electrically connected to the bottom panel where the back panel is constructed of an electrically conductive material. The grounding system also includes a low impedance hinge constructed of an electrically conductive material. The low impedance hinge electrically connects the top panel with the back panel.

In another aspect of the invention, a portable computer system includes a lid portion, a base portion, and a grounding system. The lid portion includes a display, and the base portion includes a processor and a key board. The processor is electrically coupled to the display. The grounding system includes a top panel constructed of an electrically conductive material, where the top panel is included within the lid portion. The grounding system also includes a bottom panel constructed of an electrically conductive material, where the bottom panel is included within the base portion. The grounding system further includes a back panel physically and electrically connected to the bottom panel, where the back panel is constructed of an electrically conductive material. The grounding system also includes a low impedance hinge constructed of an electrically conductive material. The low impedance hinge electrically and physically connects the top panel to the back panel.

Providing a solid ground return through both the base and the lid portions eliminates the need for external mechanical grounding connections. Solid return paths are provided so that circulating currents can easily return to their preferred ground destinations.

In preferred embodiments, one aspect of the invention not only eliminates the need for a separate heat spreader but it also improves the distribution of heat in the portable computer by transferring heat throughout the entire assembly and not just throughout the base area as with a heat spreader.

BRIEF DESCRIPTION OF THE DRAWINGS

The present invention may be better understood, and its numerous objects, features, and advantages made apparent to those skilled in the art, by referencing the accompanying drawings.

DETAILED DESCRIPTION

The following sets forth a detailed description of the best contemplated mode for carrying out the invention. The description is intended to be illustrative of the invention and should not be taken to be limiting.

Figure 1:
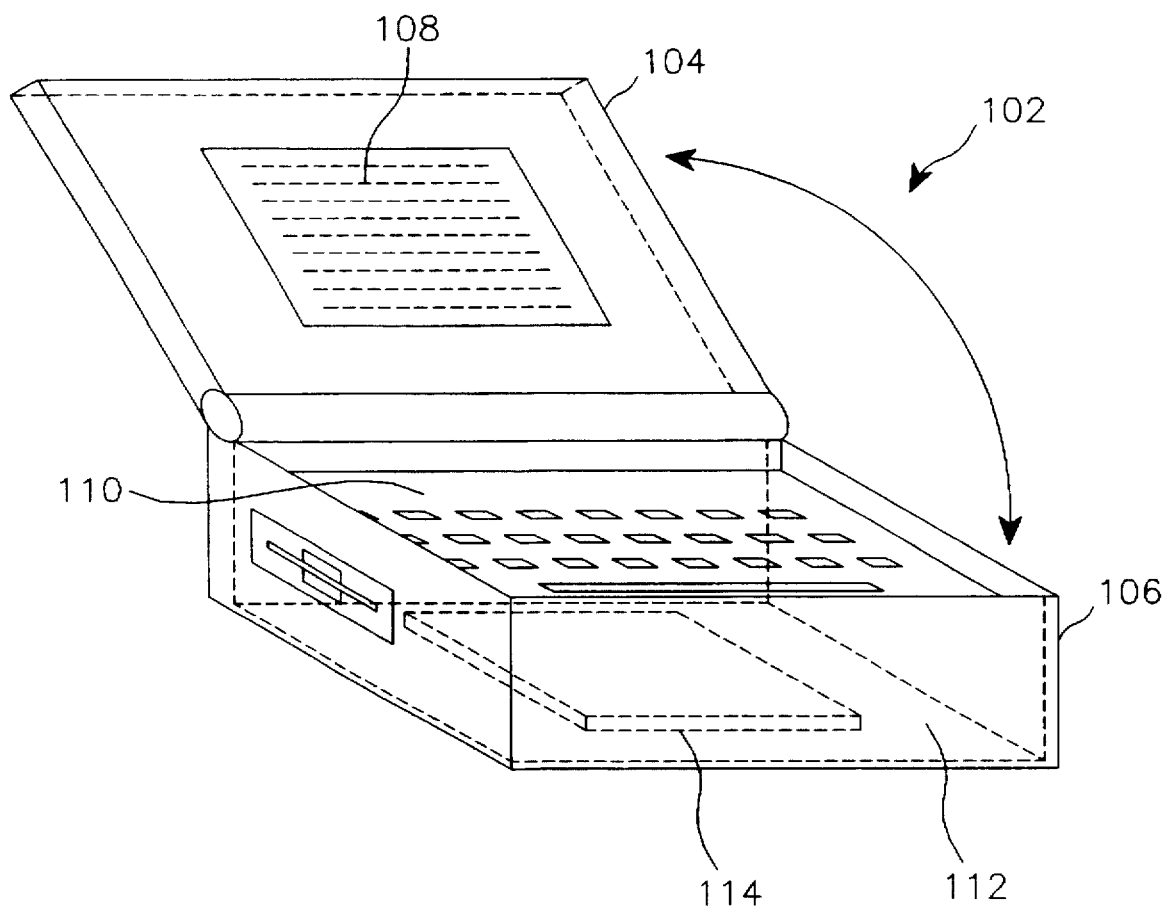
FIG. 1 is a perspective view of a portable computer.

Referring to FIG. 1, a portable computer 102 typically comprises a lid portion 104 and a base portion 106. The lid portion houses an electrical display such as an LCD panel 108. The base portion contains various computer operating and structural components such as the system planar printed wiring board (PWB) (not shown) and the processor 114. The lid portion is pivotal between a closed position in which the lid overlies a keyboard 110 on the top side of the base portion, and an open position in which the keyboard 110 is exposed and the lid portion 104 is at an obtuse angle to the top side of the base portion 106. In this open position, the LCD display 108 faces the computer user. The RF grounding system 112 is enclosed within the portable computer 102.

Figure 2:
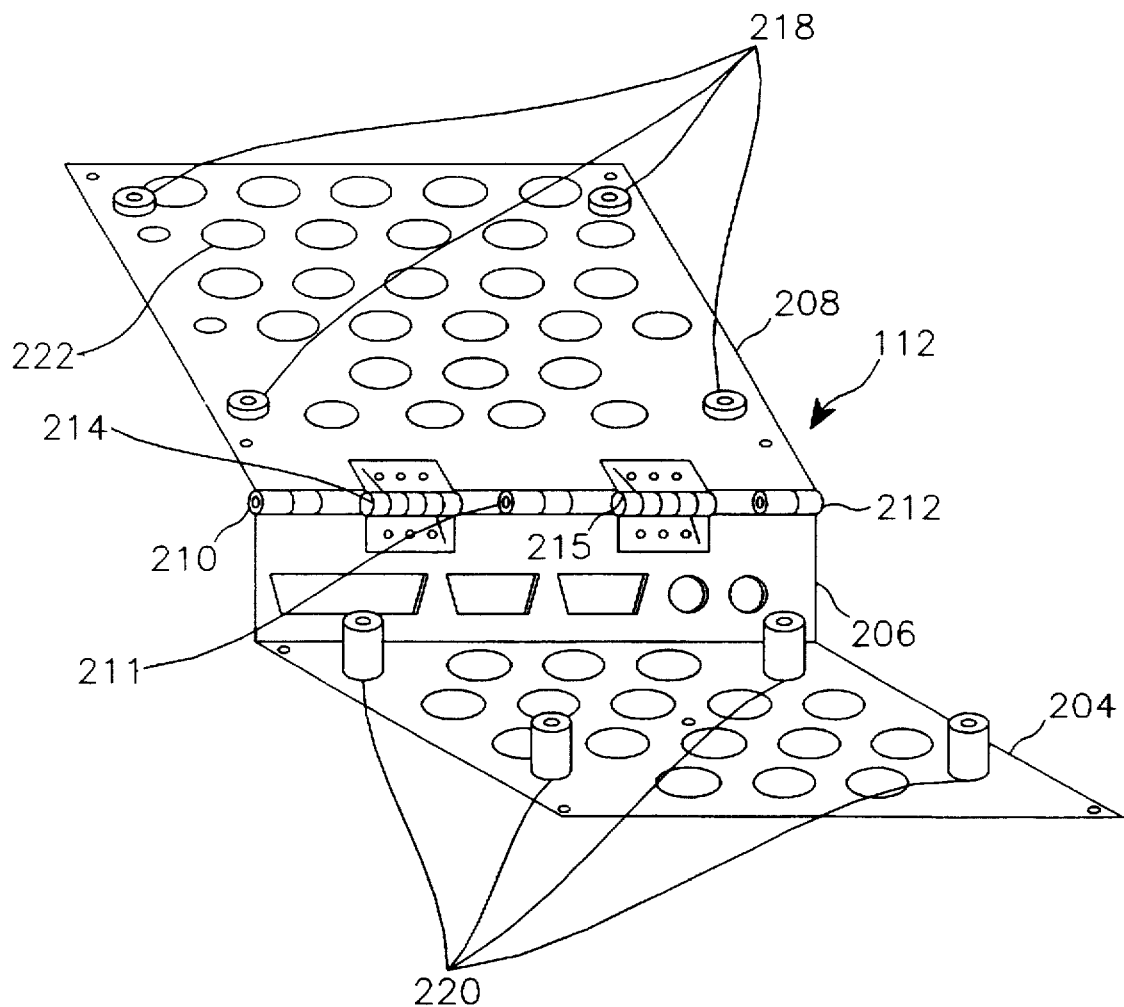
FIG. 2 is a perspective view of a preferred embodiment of the RF grounding system.
Figure 6:
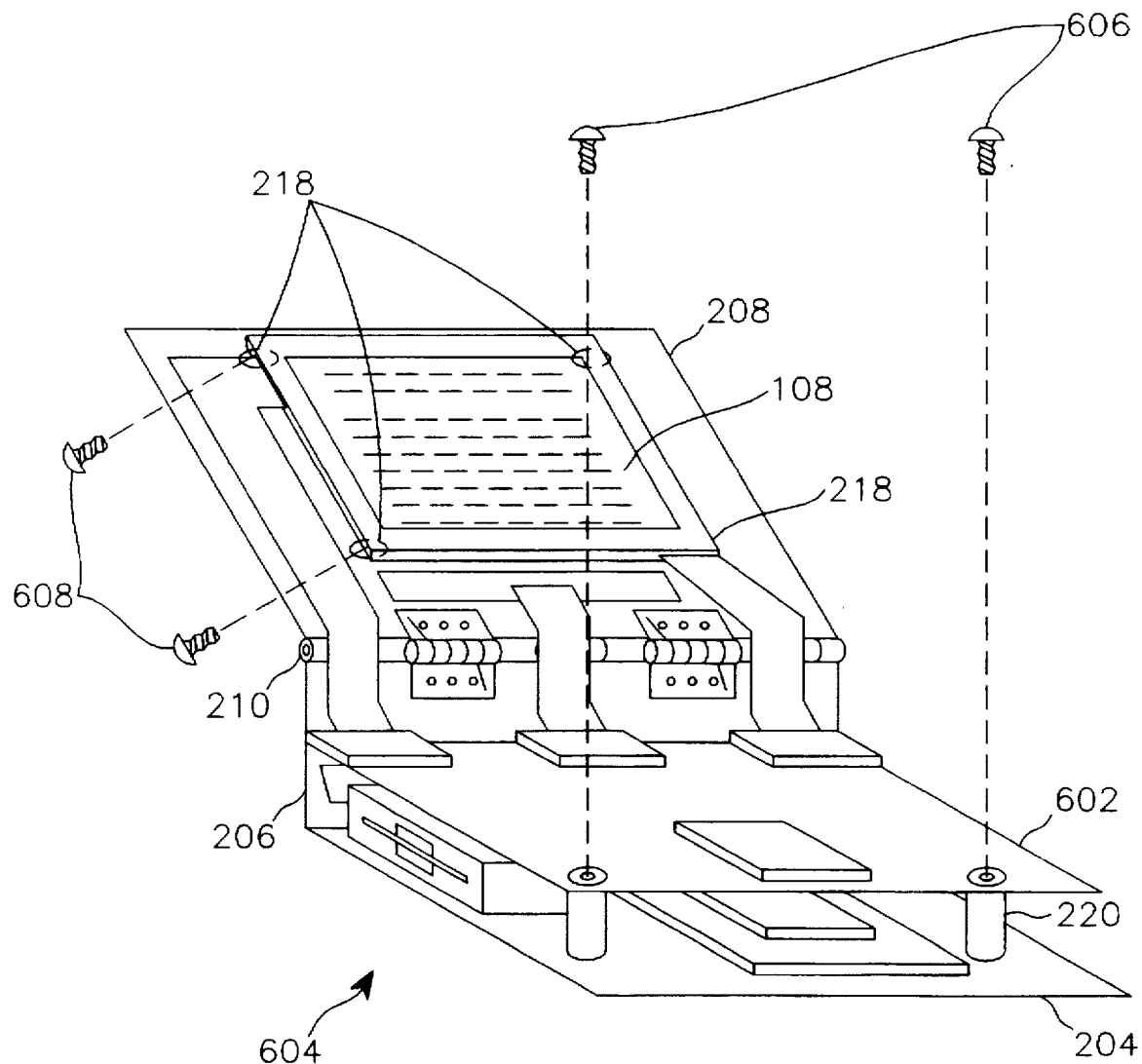
FIG. 6 is a perspective view of the invention with attached LCD panel and system planar

Referring to FIG. 2, the RF grounding system 112 includes a bottom panel 204, an input/output (I/O) back panel 206, a top panel 208, three low impedance slip joint hinges 210–12, two spring-loaded, high torque hinges 214–215, mounting bosses 218 for mounting an LCD panel (108 on FIG. 1) and mounting bosses 220 for mounting a system planar PWB (602 on FIG. 6).

The I/O back panel 206 is physically and electrically connected to an edge of the bottom panel 204 and is perpendicular to the bottom panel. In the preferred embodiment, the I/O back panel 206 and the bottom panel 204 are constructed from the same sheet of material that has been folded at a 90 degree angle to create the I/O back panel 206. Low impedance slip joint hinges 210–212 physically and electrically connect the I/O back panel 206 to the top panel 208. Spring-loaded, high torque hinges 214–215 physically connect the I/O back panel 206 to the top panel 208.

In the preferred embodiment, mounting bosses 218 are attached to the top panel 208. The LCD panel (108 on FIG. 1) is attached to the mounting bosses 218 with the use of screws (608 on FIG. 6) or other attaching devices. Mounting bosses 220 are attached to the bottom panel 204. The system planar PWB (602 on FIG. 6) is attached to the mounting bosses 220 with the use of screws (606 on FIG. 6) or other attaching devices. The LCD panel 108 and the system planar PWB 602 are provided with a system ground at the point of these connections. The purpose of the mounting bosses 218, 220 is to provide a standoff between the LCD panel 108 and top panel 208 and between the system planar PWB 602 and bottom panel 204. These standoffs help to prevent the electrical components attached to the LCD panel 108 and system planar PWB 602 from shorting out to the RF grounding system. In another embodiment, the screws 608, 606 mechanically and electrically connect LCD panel 108 to the top panel 208 via mounting bosses 218 and mechanically and electrically connect the system planar PWB 602 to the bottom panel 204 via mounting bosses 220, respectively.

The bottom panel 204, the I/O back panel 206, the top panel 208, the low impedance slip joint hinges 210–212, and the mounting bosses 218, 220 should all be constructed from the same electrically conductive material to minimize any impedance mismatches in the grounding system. The material of choice should be light-weight and highly conductive. The screws do not necessarily have to be made of the same material as long as the material used has good electrical mating characteristics with the material used for the panels, hinges, and bosses. In another embodiment, the spring-loaded, high torque hinges 214–215 are also made of the same electrically conductive material as the panels, hinges, and bosses.

Perforations 222 are included in both the bottom and top panels 204 and 208 to further reduce the weight of the grounding system. The diameter of the perforations should not exceed 1/10 the wavelength of the fastest signal source, such as a clock source, in the computer system 102. For example, the hole diameter should not exceed 30 cm for a system running at 100 MHz. More specifically:

$$\lambda = \frac{c}{f}$$

where λ=wavelength, c=the speed of light≅3×10⁸ meters/ second, and f=frequency. In one embodiment, a significant portion of the surface area of the panels (>25%) is perforated by the perforations.

The grounding system 112 forms a complete RF ground reference for the entire computer system. The point-to-point impedance between any point within the assembled grounding structure should not exceed 0.25 mΩ of DC resistance.

Figure 3:
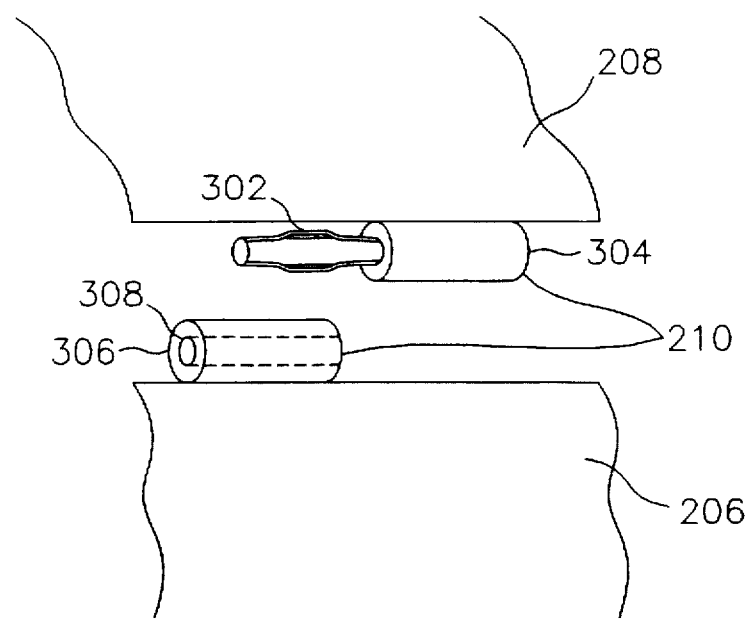
FIG. 3 is a perspective view of a slip joint hinge.

As discussed above, grounding system 112 includes two different types of hinges, slip joint hinges 210–212, and high torque hinges 214–215. Referring to FIG. 3, a slip joint hinge 210 with a banana plug type male intrusion member 302 is used to provide a low impedance electrical connection between the top panel 208 and I/O back panel 206. FIG. 3 shows a separated slip joint hinge. One part of the hinge 304 is physically and electrically connected to the top panel 208 and to the banana type male intrusion member 302. The second part of the slip joint hinge 306 is physically and electrically connected to the I/O back panel 206. To connect the hinge, the male intrusion member 302 is inserted into the hollow center 308 of the second part of the hinge 306. The impedance of the hinge should not exceed 0.25 mΩ of DC resistance.

Figure 4:
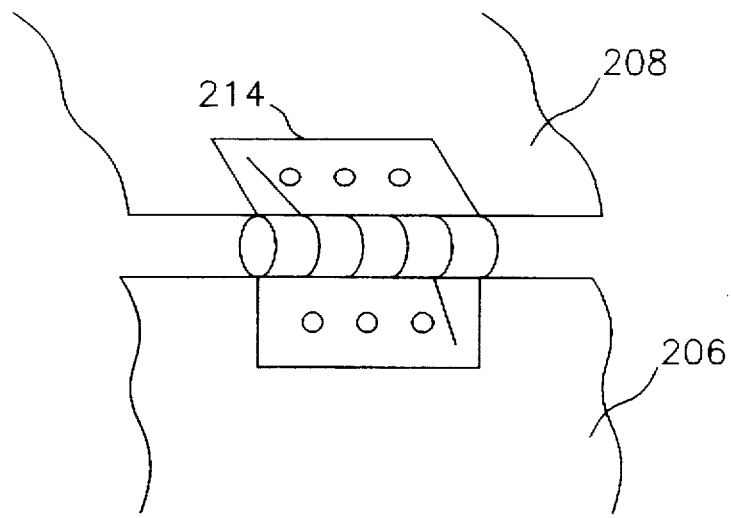
FIG. 4 is a perspective view of a spring-loaded, high torque hinge.

Referring to FIG. 4, a known spring-loaded, high torque hinge 214 is used to provide mechanical stability for the display. The hinge 214 is attached to the I/O back panel 206 and the top panel 208. This hinge allows the user to pivotally position the lid portion 104 in different viewing positions and keep the display from "slamming" shut against the base portion 106.

Figure 5:
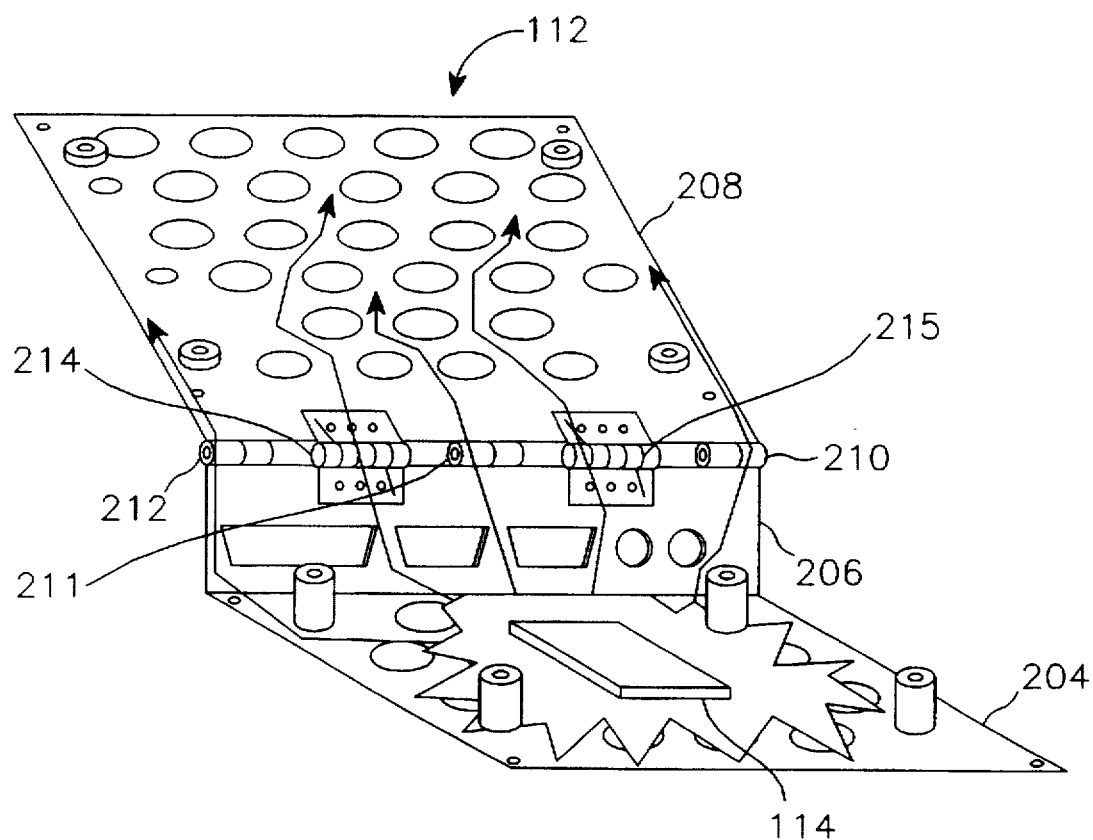
FIG. 5 is a perspective view of the invention operating as a heat distributing system.

Referring to FIG. 5, the RF grounding system 112 also functions as a heat sink for a processor 114 and other heat producing devices. In the proposed scheme, a processor 114 is mounted on the side of the PWB (not shown) that faces the bottom panel 204. Heat is dispersed from the processor 114 to the bottom panel 204 and then to the top panel 208 via the I/O back panel 206, slip-joint hinges 210–212 and spring-loaded, high torque hinges 214–215.

Figure 7:
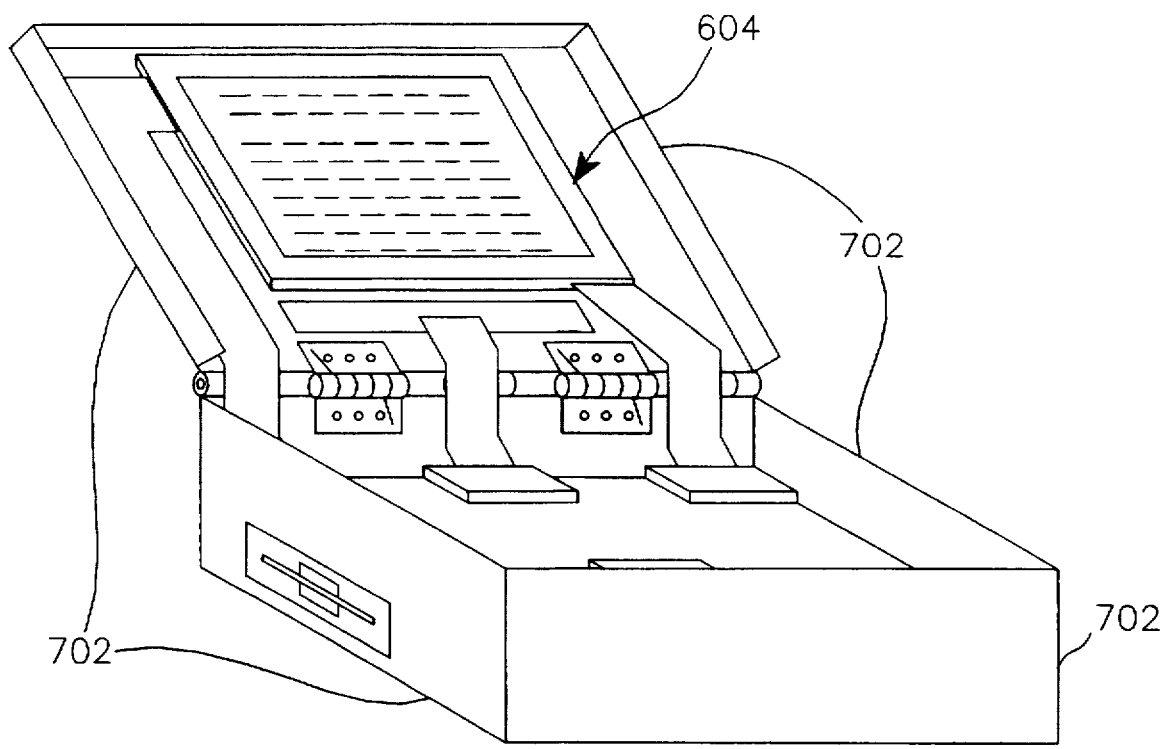
FIG. 7 is a perspective view of the invention partially encased in attached plastics.

Referring to FIG. 6, in the preferred embodiment, an LCD panel 108 is mounted on bosses 218 which are attached to the top panel 208 with the use of screws 608 or other attaching devices. The system planar PWB 602 is mounted on bosses 220 which are attached to the bottom panel 204 with the use of screws 606 or other attaching devices. The entire grounding system 112, the attached system planar PWB 602, and the attached LCD panel 108 form an inner assembly 604. Referring to FIG. 7, mating plastics 702 are attached to the inner assembly 604. FIG. 1 shows the completed assembly.

Figure 8:
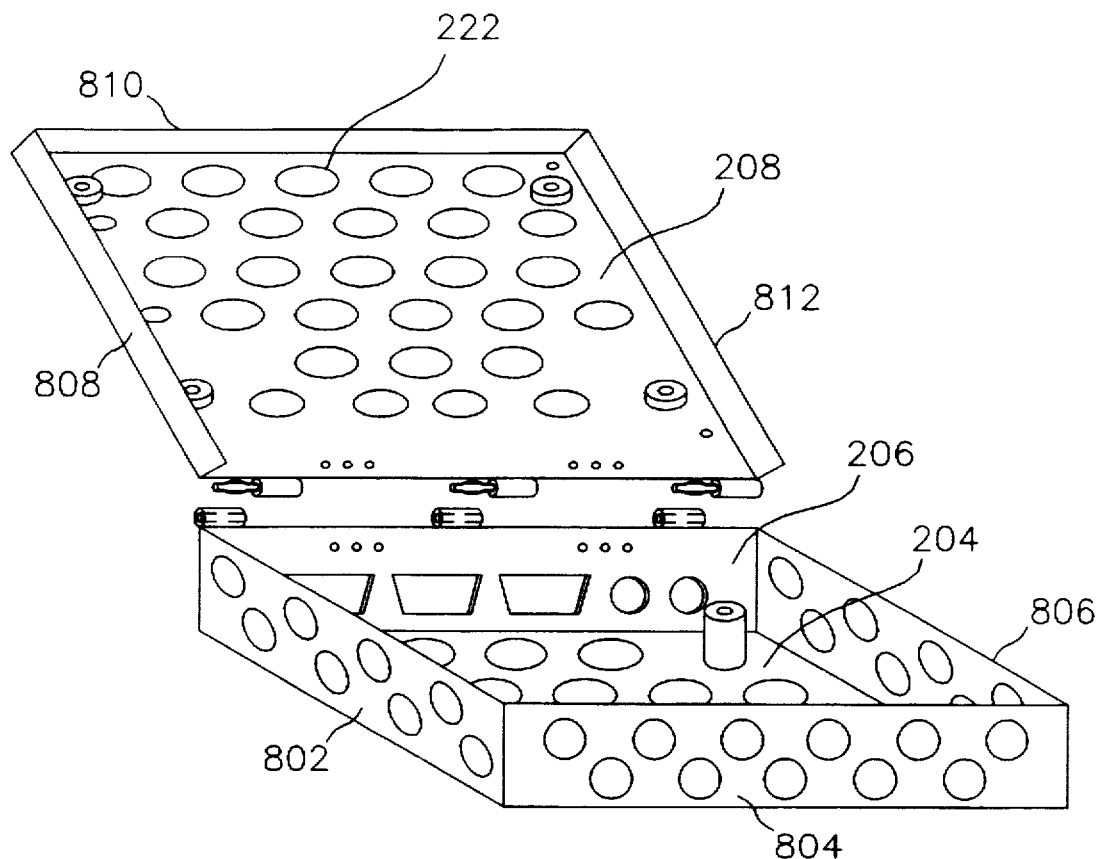
FIG. 8 is a perspective view of an embodiment of the RF grounding system that includes side panels.

Referring to FIG. 8, in another embodiment of the invention, side panels are attached to both the top and bottom panels 208 and 204 to obtain 100% electromagnetic shielding of the outer surface of the portable computer. This embodiment eliminates the need to apply a conductive coating to the plastic chassis of the portable computer. Panels 802, 804, and 806 extend perpendicularly upwards from the edge of the bottom panel 204. These panels also contain perforations 222 to reduce of weight of the grounding system. Panels 808, 810, and 812 extend perpendicularly from the edge of the top panel. These side panels may be constructed by folding at 90 degree angles the sheets of material use to make the top and bottom panels.

OTHER EMBODIMENTS

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A grounding system comprising:

a top panel constructed of an electrically conductive material;

a bottom panel constructed of a electrically conductive material;

a back panel physically and electrically connected to the bottom panel, where the back panel is constructed of an electrically conductive material;

a low impedance hinge constructed of an electrically conductive material, the low impedance hinge electrically connecting the top panel with the back panel;

wherein to low impeadance hinge is a slip joint hinge with a banana plug type male intrusion member.

2. The grounding system of claim 1, where the top panel, the bottom panel, the back panel, and the low impedance hinge are all constructed of the same electrically conductive material.

3. The grounding system of claim 1 where a signal source is coupled to the grounding system, the signal source operating at a frequency and having a corresponding wavelength, where the bottom panel of the grounding system has at least one perforation, where the width of the perforation is less than or equal to one tenth of the wavelength.

4. The grounding system of claim 3, wherein the bottom panel has a surface area, where a significant portion of the surface area of the bottom panel is perforated by a plurality of the perforations.

5. The grounding system of claim 1, where the bottom panel has a surface area, where a significant portion of the surface area is perforated.

6. The grounding system of claim 1, where a signal source is coupled to the grounding system, the source operating at a frequency and having a corresponding wavelength, where the top panel of the grounding system has at least one perforation, where the width of the perforation is less than or equal to one tenth of the wavelength.

7. The grounding system of claim 6, where the top panel has a surface area, where a significant portion of the surface area of the top panel is perforated by a plurality of the perforations.

8. The grounding system of claim 1, where the top panel has a surface area, where a significant portion of the surface area of the top panel is perforated.

9. The grounding system of claim 1, where the grounding system further comprises:

a side panel physically and electrically connected to an edge of the bottom panel and extending from the edge of the bottom panel.

10. The grounding system of claim 9, where a signal source is coupled to the grounding system, the source operating at a frequency and having a corresponding wavelength, where the side panel of the grounding system has at least one perforation, where the width of the perforation is less than or equal to one tenth of the wavelength.

11. The grounding system of claim 10, where the side panel has a surface area, where a significant portion of the surface area of the side panel is perforated by a plurality of the perforations.

12. The grounding system of claim 9, where the side panel has a surface area, where a significant portion of the surface area of the side panel is perforated.

13. The grounding system of claim 1, where the grounding system further comprises:
 a side panel physically and electrically connected to an edge of the top panel and extending from the edge of the top panel.

14. The grounding system of claim 1, where the grounding system further comprises:
 a spring-loaded hinge, the spring-loaded hinge physically connects the top panel to the back panel, where the spring-loaded hinge enables the top panel to remain at different positions relative to the bottom panel.

15. The grounding system of claim 14, where the top panel, the bottom panel, the back panel, the low impedance hinge, and the spring-loaded hinge are all constructed of the same electrically conductive material.

16. A portable computer system comprising:
 a lid portion including a display;
 a base portion including a processor, the processor being electrically coupled to the display; and
 a grounding system including:
  a top panel constructed of an electrically conductive material, where the top panel is included within the lid portion;
  a bottom panel constructed of an electrically conductive material, where the bottom panel is included within the base portion;
  a back panel physically and electrically connected to the bottom panel, where the back panel is constructed of an electrically conductive material; and
  a low impedance hinge constructed of an electrically conductive material, where the low impedance hinge electrically and physically couples the top panel to the back panel;
 wherein the low impedance hinge is a slip joint hinge with a banana plug type male intrusion member.

17. The portable computer system of claim 16, where the top panel, the bottom panel, the back panel, and the low impedance hinge are all constructed of the same electrically conductive material.

18. The portable computer system of claim 16, further comprising:
 a signal source operating at a frequency and having a corresponding wavelength, where the bottom panel of the grounding system has at least one perforation, where the width of the perforation is less than or equal to one tenth of the wavelength.

19. The portable computer system of claim 18, where the bottom panel has a surface area, where a significant portion of the surface area of the bottom panel is perforated by a plurality of the perforations.

20. The portable computer system of claim 16, where the bottom panel has a surface area, where a significant portion of the surface area is perforated.

21. The portable computer system of claim 16, further comprising:
 a signal source operating at a frequency and having a corresponding wavelength, where the top panel of the grounding system has at least one perforation, where the width of the perforation is less than or equal to one tenth of the wavelength.

22. The portable computer of claim 21, where the top panel has a surface area, where a significant portion of the surface area of the top panel is perforated by a plurality of the perforations.

23. The portable computer system of claim 16, where the top panel has a surface area, where a significant portion of the surface area is perforated.

24. The portable computer system of claim 16, where the grounding system further includes:
 a side panel physically and electrically connected to an edge of the bottom panel and extending from the edge of the bottom panel.

25. The portable computer system of claim 24, further comprising:
 a signal source operating at a frequency and having a corresponding wavelength, where the side panel of the grounding system has at least one perforation, where the width of the perforation is less than or equal to one tenth of the wavelength.

26. The portable computer system of claim 25, where the side panel has a surface area, where a significant portion of the surface area of the side panel is perforated by a plurality of the perforations.

27. The portable computer system of claim 24, where the side panel has a surface area, where a significant portion of the surface area of the side panel is perforated.

28. The portable computer system of claim 24 wherein:
 the side panel and the bottom panel are formed from the same sheet of material;
 the sheet is folded to form the side panel and bottom panel.

29. The portable computer system of claim 16, where the grounding system further includes:
 a side panel physically and electrically connected to an edge of the top panel and extending from the edge of the top panel.

30. The portable computer system of claim 29 wherein:
 the side panel and the top panel are formed from the same sheet of material;
 the sheet is folded to form the side panel and top panel.

31. The portable computer system of claim 16, further comprising:
 a spring-loaded hinge, the spring-loaded hinge physically connects the top panel to the back panel, where the spring-loaded hinge enables the top panel to remain at different positions relative to the bottom panel.

32. The portable computer system of claim 31, where the top panel, the bottom panel, the back panel, the low impedance hinge, and the spring-loaded hinge are all constructed of the same electrically conductive material.

33. The portable computer system of claim 16, where the display is mechanically and electrically coupled to the top panel.

34. The portable computer system of claim 16, where the lid portion further includes:
 a mounting boss attached to the top panel and the display, where the mounting boss spatially separates the display from the top panel.

35. The portable computer system of claim 16, where the base portion further includes:
 a mounting board that is mechanically and electrically coupled to the bottom panel.

36. The portable computer system of claim 16, where the base portion further includes:
 a mounting board;
 a mounting boss attached to the bottom panel and the mounting board, where the mounting boss spatially separates the mounting board from the bottom panel.

37. The portable computer system of claim 36, where the processor is attached to a side of the mounting board facing the bottom panel, where the low impedance hinge is thermally conductive, where heat produced by the processor is dispersed from the processor to the top panel through the low impedance hinge.

38. The portable computer system of claim 37, further comprising:

a spring-loaded hinge, the spring-loaded hinge physically connects the top panel to the back panel, where the spring-loaded hinge enables the top panel to remain at different positions relative to the bottom panel, where the spring-loaded hinge is thermally conductive, where heat produced by the processor is dispersed from the processor to the top panel through the spring-loaded hinge.

39. The portable computer system of claim 17 wherein:

the lid portion has an interior planar side; and the top panel is substantially coextensive with the interior planar side.

40. The portable computer system of claim 17 wherein:

the display has a first dimension, the first dimension is generally perpendicular to a direction that the viewing portion of the display faces;

the top panel has a first dimension;

the first dimension of the top panel is greater than the first dimension of the display.

41. The portable computer system of claim 17 wherein:

the display having a width and a length dimension, both the width and length dimensions are generally perpendicular to a direction that the viewing portion of the display faces;

the top panel has a width and a length dimension;

the length dimension of the top panel is greater than the length dimension of the display;

the width dimension of the top panel is greater than the width dimension of the display.

42. The portable computer system of claim 16 wherein:

the base portion has an interior planar side;

the bottom panel is substantially coextensive with the interior planar side.

43. The portable computer system of claim 16 wherein:

the back panel and the bottom panel are formed from the same sheet of material;

the sheet is folded to form the back panel and bottom panel.

44. A portable computer system comprising:

a lid portion including a display, the lid portion having an interior planar side;

a base portion including a processor, the processor being electrically coupled to the display, the base portion having an interior planar side; and a grounding system including:

a top panel constructed of an electrically conductive material, where the top panel is included within the lid portion; the top panel being substantially coextensive with the interior planar side of the lid portion;

a bottom panel constructed of an electrically conductive material, where the bottom panel is included within the base portion, the bottom panel being substantially coextensive with the interior planar side of the base portion;

a back panel physically and electrically connected to the bottom panel, where the back panel is constructed of an electrically conductive material; and a low impedance hinge constructed of an electrically conductive material, where the low impedance hinge electrically and physically couples the top panel to the back panel;

wherein the low impedance hinge is a slip joint hinge with a banana plug type male intrusion member.

45. The portable computer system of claim 44, wherein the grounding system further includes:

three side panels, each side panel physically and electrically connected to an edge of the bottom panel and extending from the one edge of the bottom panel.

46. The portable computer system of claim 44 further comprising:

a signal source operating at a frequency and having a corresponding wavelength;

wherein the top panel and the bottom panel of the grounding system have perforations;

wherein the width of the perforations is less than or equal to one tenth of the wavelength;

wherein a significant portion of the surface area of the top panel is perforated by a first plurality of the perforations;

wherein a significant portion of the surface area of the bottom panel is perforated by a second plurality of the perforations.

* * * * *